United States Patent [19]

Fraas

[11] 4,404,421

[45] Sep. 13, 1983

[54] TERNARY III-V MULTICOLOR SOLAR CELLS AND PROCESS OF FABRICATION

[75] Inventor: Lewis M. Fraas, Albany, Calif.

[73] Assignee: Chevron Research Company, San Francisco, Calif.

[21] Appl. No.: 352,680

[22] Filed: Feb. 26, 1982

[51] Int. Cl.³ .................. H01L 31/06; H01L 31/18
[52] U.S. Cl. .................. 136/249; 136/262; 148/174; 148/175; 357/30
[58] Field of Search .................. 136/249 TJ, 262; 357/30; 148/174, 175

[56] References Cited

U.S. PATENT DOCUMENTS

| | | | |
|---|---|---|---|
| 4,017,332 | 4/1977 | James | 136/246 |
| 4,128,733 | 12/1978 | Fraas et al. | 136/255 |
| 4,179,702 | 12/1979 | Lamorte | 357/30 |
| 4,255,211 | 3/1981 | Fraas | 136/249 |
| 4,278,474 | 7/1981 | Blakeslee et al. | 136/249 |
| 4,332,974 | 6/1982 | Fraas | 136/249 |

OTHER PUBLICATIONS

R. L. Moon et al., "Multigap Solar Cell Requirements and the Performance of AlGaAs and Si Cells in Concentrated Sunlight", *Conf. Record, 13th IEEE Photovoltaic Specialists Conf.* (1978), pp. 859–867.

S. M. Bedair et al. "Material and Device Considerations for Cascade Solar Cells", *IEEE Trans. Electron Devices,* vol. ED-27, pp. 822–831 (1980).

*Primary Examiner*—Aaron Weisstuch
*Attorney, Agent, or Firm*—D. A. Newell; E. J. Keeling; A. Stephen Zavell

[57] ABSTRACT

Ternary III-V multicolor solar cells incorporating layers of $GaAs_{1-x-y}P_xSb_y$ and an improved process of fabricating multicolor photovoltaic III-V compound photovoltaic devices.

16 Claims, 4 Drawing Figures

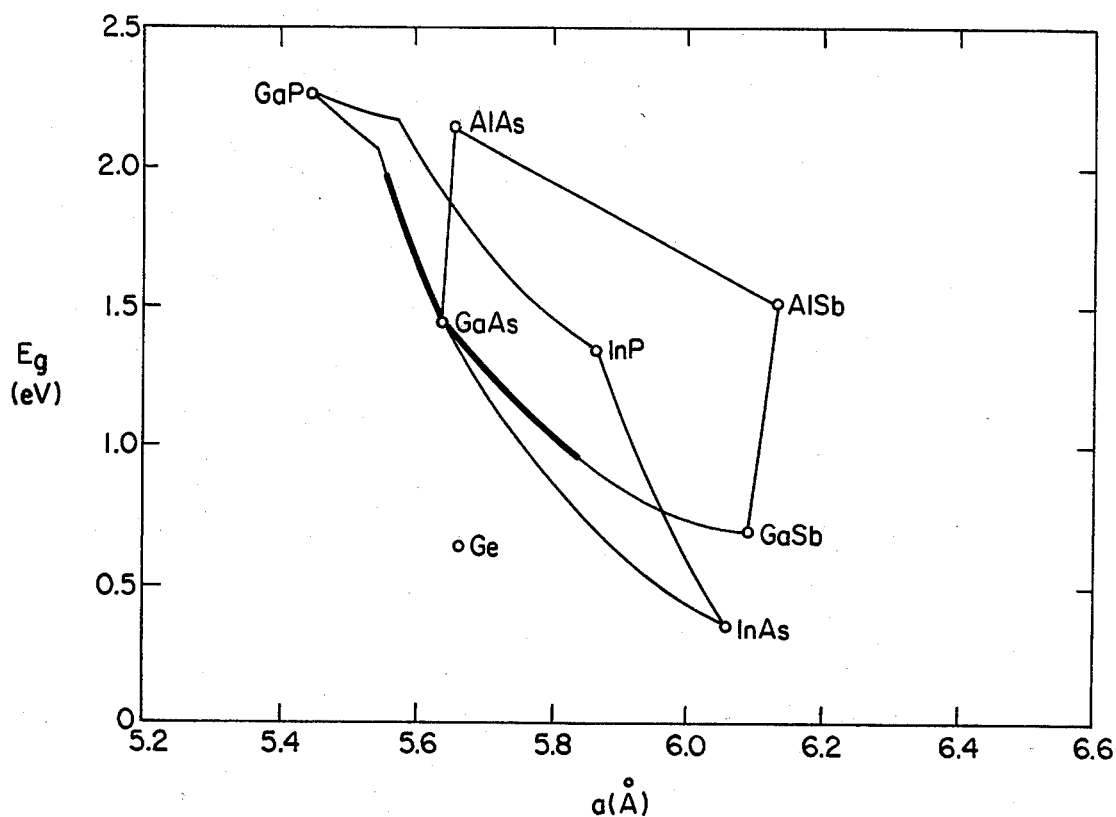
FIG._1.
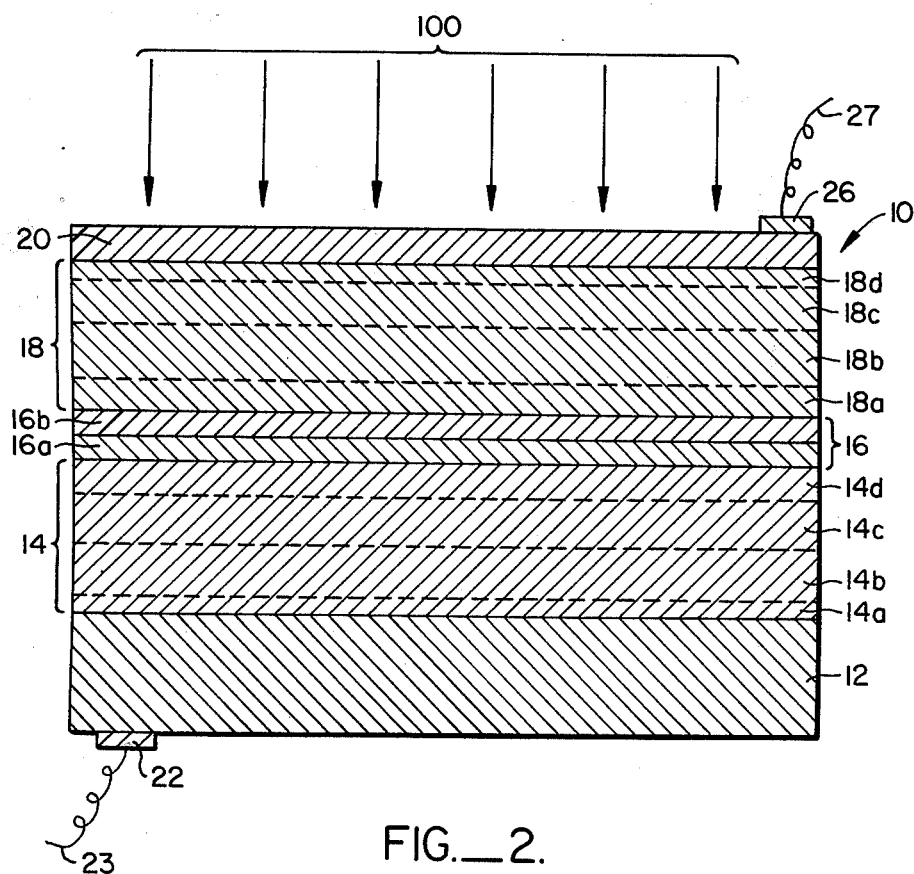
FIG._2.

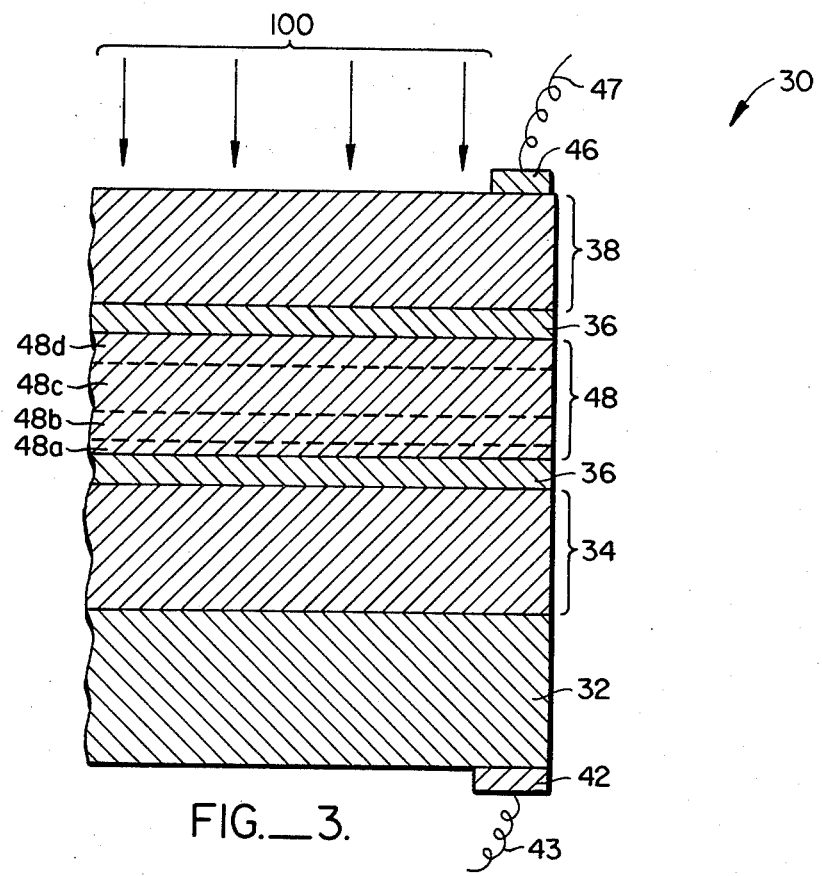
FIG._3.
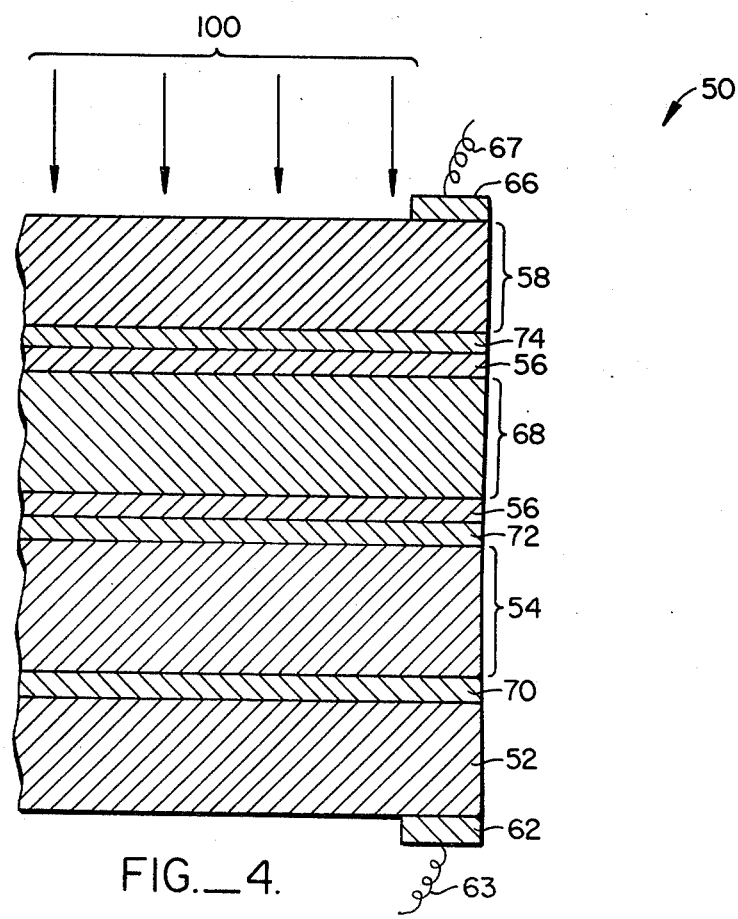
FIG._4.

TERNARY III-V MULTICOLOR SOLAR CELLS AND PROCESS OF FABRICATION

This invention relates to photovoltaic cells. More specifically, this invention relates to ternary III-V multicolor solar cells.

BACKGROUND OF THE INVENTION

Photovoltaic cells such as silicon or III-V compound solar cells are capable of converting solar radiation into usable electrical energy. The electrical energy conversion occurs as a result of what is well known in the solar cell field as the photovoltaic effect. Solar radiation impinging on a solar cell is absorbed by the semiconductor layer, which generates electrons and holes. The electrons and holes are separated by a built-in electric field, for example, a rectifying junction such as a PN junction in the solar cell. The electrons flow towards the N-type region and the holes flow towards the P-type region. The separation of the electrons and holes across the rectifying junction results in the generation of an electric current known as the photocurrent and an electric voltage known as the photovoltage.

Photovoltaic researchers have been investigating various paths toward the generation of electricity from sunlight on an economic basis which can compete with conventional means of generating electricity. The research has focused mainly on two alternatives for economically making electricity from solar cells. For the first alternative, researchers are trying to make low-cost non-crystalline solar cells, such as amorphous silicon cells, and thereafter deploy the cells as large area flat plate arrays. For the second alternative, researchers use a plastic lens as the large area collector in combination with smaller but higher efficiency solar cells. The lens (or array of lenses) focuses the sunlight onto the small area single crystal solar cell (or array of solar cells).

This invention focuses on improved high efficiency single crystal solar cells for the second alternative although if the materials costs were lowered, the cell could be used in the first alternative. To date, the solar cells with the highest conversion efficiencies have been fabricated from the III-V compound semiconductor material, GaAs.

Multicolor solar cells, i.e., cells which absorb light at two or more wavelengths in two or more materials, promise still higher conversion efficiencies. Multicolor solar cells have been described in various U.S. Pat. Nos. such as 4,017,332; 4,179,702; and 4,128,733; and in various technical publications such as the Fifteenth IEEE Photovoltaic Specialists Conference, 1981, pp. 1289-1293.

Multicolor solar cells are formed from various semiconductors each containing a light sensitive junction and each semiconductor material is sensitive to a different portion of the solar spectrum. The simplest, lowest cost multicolor cell is formed by growing these various layers in succession as a stack of single crystal films on a single crystal wafer.

Devices have been fabricated with $Al_{1-x}Ga_xAs_ySb_{1-y}$, $Al_{1-x-y}Ga_xIn_yAs$, or $Ga_{1-x}In_xAs_yP_{1-y}$ material systems employing vertical lattice matching with, for example, $GaAs_{1-x}Sb_x$, $Ga_{1-x}In_xAs$, and $Al_{1-x}Ga_xAs_{1-y}Sb_y$, $Ga_{1-x}In_xP$, respectively.

The growth systems used to fabricate these devices have employed rapid layer growth via liquid phase epitaxy systems (LPE) or metal organic chemical vapor deposition systems (CVD) operating at 1 atmosphere total pressure.

The Al containing compounds exhibit stability problems when exposed to ambient conditions. Al has an affinity for oxygen and carbon incorporation. This makes oxygen and carbon impurity incorporation a problem during film growth and it makes the final devices less stable in outdoor deployment in moist air.

Growth of the $Ga_{1-x}In_xAs_{1-y}P_y$ compound by metal organic CVD has experienced chemical problems resulting from the indium metal organic transport agent, triethyl indium (TEIn). One problem is that TEIn has a very low vapor pressure, making it difficult to supply to the growth zone. A second problem with TEIn is that it reacts prematurely at room temperature with $AsH_3$ and $PH_3$. The resultant compound, formed by alkane elimination, is not volatile. These problems make it difficult to work with the GaInAsP system.

U.S. Pat. No. 4,278,474 describes using Si, GaAsP and GaAs/GaAsP superlattices. However, this system suffers from two problems. First, large lattice mismatch, and second, very large thermal expansion coefficient mismatch. The lattice mismatch is about 4%. Superlattices have been fabricated to solve the first problem. However, the problem of thermal mismatch is more difficult to solve. The GaAsP layer grown on Si is in thermal equilibrium at the growth temperature; when cooled, it shrinks much more than does the silicon substrate. The result is a cracked GaAsP layer which ruins the solar cell.

Thus, it would be highly desirable to have a ternary III-V compound semiconductor material system which does not contain elements which cause the fabricated layer to react with ambient weather conditions which shorten the lifetime of the photovoltaic device, e.g., $Al_{1-x}Ga_xAs$. Furthermore, it would be desirable to have ternary or quaternary III-V layers which lattice match to within ±1% and do not require superlattices, e.g., U.S. Pat. No. 4,278,474, to avoid the mismatching of the active layers of a multicolor photovoltaic cell. In addition, it would be a desirable option to have a multicolor cell which can incorporate very thin transition layers to avoid or reduce the mismatch between the active layers. It would also be desirable to have a multicolor cell which was not restricted to selecting materials that lattice match only a single lattice constant, wherein the layer's composition is fixed by the need to grow vertically up a material system from a III-V compound alloying on the V side, e.g., $GaAs_{1-x}Sb_x$, to a III-V compound alloying on the III and V sides, e.g., $Al_{1-x}Ga_xAs_{1-y}Sb_y$. It would also be desirable to have a growth process which permits the multiple layers to be fabricated at lower temperatures of about 500° C. to about 650° C. and at lower growth rates of about from 1 μm/m to about 10 μm/m than are required by LPE. It would also be desirable to have a multicolor cell system wherein the layers are alloyed on the V side and with V compounds which can be supplied in excess, because of their volatility, without affecting the semiconductor layer. It would be desirable to avoid a layer fabricated from materials, e.g., triethyl indium (TEIn) which prematurely react with the other compounds, e.g., $AsH_3$ and $PH_3$, needed to form the semiconductor layer.

SUMMARY OF THE INVENTION

These and other desirable properties are incorporated into my multicolor solar cell and process of fabrication invention. The invention utilizes the $GaAs_{1-x-y}Sb_yP_x$ semiconductor alloys. The alloys have bandgap energies which are responsive to solar radiation in the range of from about 1.3 to about 0.35 microns (μm).

Two- and three-color cells can be fabricated. The two-color cell comprises homojunction layers of $GaAs_{1-y}Sb_y$ for the low bandgap cell and $GaAs_{1-x}P_x$ for the high bandgap cell. The cells can be fabricated on GaAs or Ge substrates. Shorting junctions separate the $GaAs_{1-x}P_x$ and $GaAs_{1-y}Sb_y$ cells. Suitable shorting junctions can be fabricated with layers of GaAs or Ge of from about 0.0075 micron, i.e., 75 Å, to about 0.1 micron thick.

Three-color cells are fabricated with $GaAs_{1-y}Sb_y$ for the low bandgap, GaAs for the mid bandgap, and $GaAs_{1-x}P_x$ for the high bandgap cells. Each homojunction layer is separated by a shorting junction. This construction limits lattice mismatch at each stage between layers to about ±1%. The light sensitive junctions are within the layers and thus removed from mismatch interfaces. In a preferred embodiment, the mismatch is further reduced by adding a transition layer of about 0.02 μm thick of an intermediate composition alloy at each interface between the active layers of the multicolor cell. For example, the mismatch between layers in a three-color cell is reduced to about ±0.5% if a layer of $GaAs_{0.9}Sb_{0.1}$ is fabricated between the GaAs cell and the low bandgap cell having a composition of $GaAs_{0.8}Sb_{0.2}$ or between the GaAs substrate and the low bandgap cell. Similarly, a layer of $GaAs_{0.9}P_{0.1}$ between the high bandgap cell having a composition of $GaAs_{0.8}P_{0.2}$ and the middle bandgap GaAs cell reduces the mismatch. The transition layers do not contain light sensitive junctions.

BRIEF DESCRIPTION OF THE DRAWINGS

FIG. 1 illustrates the $GaAs_{1-x-y}Sb_yP_x$ semiconductor alloys.

FIG. 2 illustrates a cross-sectional view of a two-color III-V compound photovoltaic cell incorporating light sensitive homojunction layers of $GaAs_{1-y}Sb_y$ and $GaAs_{1-x}P_x$.

FIG. 3 illustrates a partial cross-sectional view of a three-color III-V compound photovoltaic cell incorporating light sensitive homojunction layers of $GaAs_{1-y}Sb_y$, GaAs, and $GaAs_{1-x}P_x$.

FIG. 4 illustrates a partial cross-sectional view of a three-color III-V compound photovoltaic cell as in FIG. 3 further incorporating transition layers between the active homojunction layers.

DETAILED DESCRIPTION OF THE INVENTION

FIG. 1 illustrates the $GaAs_{1-x-y}Sb_yP_x$ semiconductor alloys described herein. Plotted is the lattice constant vs. bandgap energy for III-V semiconductor alloys and germanium (group IV). The $GaAs_{1-x-y}Sb_yP_x$ alloys are highlighted by the heavy solid line. For x and y ≦ 0.4, the bandgap energies of the semiconductor alloys span the range from about 0.95 eV to about 1.9 eV. The breadth of the possible bandgap energies makes these semiconductor alloys ideally suited for fabricating two- and three-color concentrator solar cells. Whereas previous researchers have picked compounds which span the energy range vertically (y axis) with constant lattice constant (x axis), irrespective of the compound chemistry, my invention spans the same range while allowing small lattice constant changes per step and small chemical changes on the Group V site per step. This facilitates the fabrication of the multicolor cells.

A two-color solar cell incorporating my invention is illustrated as solar cell 10 in FIG. 2. Solar radiation 100 serves as a reference point for the top and bottom of each layer or region. Solar cell 10 has a substrate 12 of germanium, gallium arsenide or other suitable material. The substrate can be either N-type or P-type conductivity. If the substrate is N-type conductivity, then the homojunction layers are NP junctions. Alternatively and for FIGS. 3 and 4 as well, the substrate can be of P-type conductivity and the homojunction layers can be PN junctions. The substrate 12 can be of P+-type conductivity having a dopant concentration on the order of $1 \times 10^{18}$ dopant atoms per cubic centimeter (Da/cc) with a suitable P-type conductivity modifier such as zinc, cadmium, magnesium, and the like.

A first homojunction layer 14 of $GaAs_{1-y}Sb_y$ is fabricated on substrate 12. The $GaAs_{1-y}Sb_y$ layer is lattice matched to the substrate to within about ±1%. I have discovered that when using vacuum metal organic-chemical vapor deposition (MO-CVD), lattice mismatching of up to about ±1% can be tolerated without seriously affecting the overall performance of the solar cell, although as close a lattice match as possible to the lattice constant of the substrate is preferred.

The $GaAs_{1-y}Sb_y$ layer 14 has the y value adjusted according to the solar spectrum to maximize energy conversion and to provide a bandgap which is less than the bandgap of any higher bandgap layers such as the top homojunction semiconductor layer 18. Normally, the $GaAs_{1-y}Sb_y$ layer is selected to have its major absorptance towards the IR range of the spectrum while the top layer 18 is selected to have an absorptance in the visible and ultraviolet range of the solar spectrum. y can vary from about 0.1 to about 0.4 and preferably from about 0.2 to about 0.3. For example, a $GaAs_{1-y}Sb_y$ layer, wherein y is 0.2, i.e., a layer of $GaAs_{0.8}Sb_{0.2}$, has a bandgap energy of about 1.1 electron volts (eV) and is suitable as the low band homojunction layer.

Layer 14 is from about 2.5 μm to about 3.5 μm thick and has regions of differing conductivity 14a, 14b, 14c, and 14d which form a homo PN junction therein. The first region 14a of P+-type conductivity has a dopant concentration of about $6 \times 10^{18}$ Da/cc and a thickness of about 0.1 to 0.3 μm. The second region 14b of layer 14, has P-type conductivity with a dopant concentration of about $3 \times 10^{17}$ Da/cc and a thickness of about 2 to 2.5 μm. Region 14b forms a homojunction with the third region 14c of N-type conductivity. Region 14c has a dopant concentration of about $1 \times 10^{18}$ Da/cc N-type dopant atoms and a thickness of about 0.2 to 0.7 μm. Suitable N-type dopant atoms are selenium, tellurium, or sulfur, and the like. Region 14c is graded to N+-type conductivity in a region 14d. The dopant concentration of region 14d is about $1 \times 10^{19}$ Da/cc and has a thickness of about 0.04 to 0.08 μm. Region 14d contacts a shorting junction 16 which separates the higher bandgap homojunction layer 18 from the layer 14.

The shorting junction 16 can be a germanium layer doped N+-type or P+-type conductivity as taught in my U.S. Pat. No. 4,255,211, incorporated herein by reference, or a layer 16 of a material such as GaAs having a region 16a of GaAs doped N+-type conductivity and contacting layer 14 with a second region 16b doped P+-type conductivity of GaAs. A tunnel junction in layer 16 permits the transport of electrons between semiconductor layer 14 and semiconductor layer 18 without the formation of a counter PN junction between region 14d and region 18a which would lower the performance of the overall device 10. The GaAs N+/P+-type shorting junction 16 will be on the order of about 400 A thick. If N+-type or P+-type germanium is selected as the shorting junction 16, the layer is only about 0.0050 to about 0.0075 μm thick.

Contacting shorting junction 16 and lattice matching thereto to within about ±1% is a layer 18 of a material having a higher bandgap than the layer 14 such as gallium arsenide phosphide (GaAs$_{(1-x)}$P$_x$) having regions of differing conductivity 18a, 18b, 18c, and 18d. The x value can be from about 0.1 to about 0.3 and preferably about 0.2, for a bandgap energy of about 1.65 eV. Gallium arsenide phosphide is a preferred top layer because it is not affected by ambient weather conditions. This is in contrast to gallium aluminum arsenide, which is susceptible to degradation from moist air. In addition, the Group V compounds used to form the layers tend to volatilize and not cause problems with inclusion of second phase defects. Thus, the flow rate of the organometallics does not have to be monitored with extreme precision during the fabrication process.

Region 18a of P+-type conductivity is about 0.1 to 0.3 μm, and preferably about 0.2 μm thick and incorporates P-type conductivity modifiers recited previously in a concentration of about $6 \times 10^{18}$ Da/cc. Region 18b of P-type conductivity is about 2 to 3 μm, preferably about 2.2 μm thick, and has a P-type dopant concentration of about $3 \times 10^{17}$ Da/cc. Forming the PN junction with region 18b is region 18c of N-type conductivity, incorporating N-type conductivity modifiers recited previously to a doping concentration of about $1 \times 10^{18}$ Da/cc. Region 18c is about 0.2 to 0.7 μm and preferably about 0.5 μm thick. Finally, semiconductor layer 18 has a region 18d of N+-type conductivity about 0.1 μm thick with a dopant concentration of about $1 \times 10^{19}$ Da/cc.

Optionally, a passivation layer 20 of any material suitable to reduce the surface recombination velocity of the device contacts layer 18. An example of a suitable passivation layer is a gallium arsenide phosphide layer wherein x is increased slightly above its value in the layer 18. For example, if layer 18 is GaAs$_{0.8}$P$_{0.2}$, then layer 20 would be greater than that or about GaAs$_{0.75}$P$_{0.25}$. The passivation layer 20 is about 0.01 to about 0.3 μm, and preferably 0.02 μm thick.

The multijunction solar cell 10 is completed with electrical contacts 22 to substrate 12 and 26 to layer 20, respectively. Wires 25 and 27 withdraw the electrical current generated during illumination of the solar cell with solar radiation 100. The electrical contacts 22 and 26 can either be a single uniform metal layer or a grid electrode. In addition, the cell is normally used with a concentrating lens as illustrated in U.S. Pat. No. 4,255,211. Optionally, the solar cell can also include antireflection coatings and the like.

FIG. 3 illustrates a three-color solar cell 30. The substrate 32 corresponds to the substrate 12 in FIG. 2. Layer 34 is the same as layer 14 in FIG. 1. Layer 38 corresponds to layer 18 of FIG. 1; however, the bandgap of the layer 38 is adjusted to about 1.8 eV by setting x equal to about 0.3. Layers 36 correspond to layers 16 in FIG. 1.

Solar cell 30 further incorporates a homojunction GaAs layer 48 separated from layers 34 and 38 by shorting junction layers 36. The layer 48 has a bandgap energy of about 1.45 eV and a thickness of from about 2.5 to about 3.5 μm, and preferably about 3 μm. The layer 48 has regions 48a, 48b, 48c and 48d of P+-type, P-type, N-type and N+-type conductivity, respectively. The regions have comparable thicknesses to layers 36 and 38.

FIG. 4 illustrates a three-color solar cell 50 which further incorporates transition layers 70, 72, and 74. Layers 52, 54, 56, and 58 are the same as layers 32, 34, 36, and 38 of FIG. 3. Layer 68 corresponds to layer 48. Contacts and wires 62, 63, 66, and 67 correspond to 42, 43, 46, and 47 of FIG. 3. Layer 70 and 72 are of GaAs$_{1-y}$Sb$_y$, wherein y is less than y in the layer 54. For example, if layer 54 is GaAs$_{0.8}$Sb$_{0.2}$, then layers 70 and 72 are GaAs$_{0.9}$Sb$_{0.1}$. The layers 70 and 72 are about 0.02 μm thick. Layers 70 and 72 are P+-type and N+-type conductivity, respectively. Layer 74 is GaAs$_{1-x}$P$_x$ wherein x is of a lesser value than in layer 58. For example, if layer 58 is GaAs$_{0.8}$P$_{0.2}$, then layer 74 is GaAs$_{0.9}$P$_{0.1}$. Layer 74 is about 0.02 μm thick and has P+-type conductivity. The exact compositions of layers 70, 72, and 74 are adjusted to minimize defects as the compositions change from GaAs$_{1-y}$Sb$_y$ through GaAs to GaAs$_{1-x}$P$_x$.

Fabricating the multicolor solar cells 10, 30 and 50 from the GaAs$_{1-x-y}$Sb$_y$P$_x$ alloys has many additional processing benefits which are not obvious from the structures. For example, the commercially available metal organics which incorporate antimony have vapor pressures which are orders of magnitude higher than the metal organics incorporating indium. More specifically, triethyl indium (TEIn) has a vapor pressure of about 0.2 torr, whereas trimethyl antimony (TMSb) has a vapor pressure of about 110 torr. The higher vapor pressure facilitates the introduction of Sb into the growth zone. In addition, the increased volatility of the elements of Column V (i.e., Sb and P) of the Periodic Chart over Column III elements (i.e., Al or In), reduces the possibility of droplets or other deposits of the metal forming on the film as it grows and thus reduces or eliminates inclusions or other damage to the crystalline structure of the layers. Furthermore, indium compounds of metal organics of Column III tend to undergo alkane elimination reactions with arsine at room temperature. This means that more of the materials must be used to grow a given layer and also increases the possibility of contamination of the layer. The method employed by my invention is also more streamlined because all the layers of the solar cell contain gallium and arsenic and hence more uniform films can be grown because fewer gases must be changed during the growth process. With the multijunction cells of my invention, the metal organics of antimony or other Group V materials or phosphorus compounds can be changed by in situ gas sequencing to grow a multicolor, multijunction solar cell. This lowers the cost and shortens the processing time of the solar cell fabricated in comparison to alternate growth systems which require a termination of the growth process after each layer with a cooling of the substrate, exposure to the atmosphere and transportation to a second or third growth chamber for processing of the subsequent layers.

The cell can be fabricated by the process taught in U.S. Pat. No. 4,171,235, incorporated herein by reference, or by U.S. Pat. No. 4,290,385, incorporated herein by reference. More specifically, a substrate is placed in a chemical vapor deposition apparatus and the chamber is evacuated to a pressure of about $10^{-7}$ torr. The substrate is heated to a temperature of from about 500° C.

to about 650° C. and preferably about 560° C. Thereafter, sources of gallium, arsenic and antimony are opened to a flow rate of about 1 scc/min., 3 scc/min., and 3 scc/min., respectively, for each of said sources. scc/min. is an abbreviation for a standard cubic centimeter per minute and is defined as the amount of gas occupying one cubic centimeter of volume at standard conditions (1 atm, 20° C.) flowing past a point in one minute. A dopant source such as diethyl zinc enters the chamber at a flow rate of about 0.3 scc/min. to create the initial P+ layer and thereafter is slowed to about 0.01 scc/min. to create the P-type region. After growth of the P-type region, the P-type dopant source is turned off and an N-type dopant source is turned on and adjusted to an appropriate flow rate, for example, about 0.1 scc/min., to grow the N-type region of the layer, followed by an increased flow rate, for example, about 0.3 scc/min., for about 1 minute to create an N+ region. A shorting junction of germanium or other suitable material is grown on top of the $GaAs_{1-y}Sb_y$ layer by turning off the gallium, arsenic and antimony sources and passing a source of germanium over layer 14 for about 3 minutes at a flow rate of about 5 scc/min. Finally, a top layer of semiconductor material having a larger bandgap than layer 14 such as $GaAs_{1-x}P_x$ is fabricated by methods analagous to that used to fabricate layer 14 or as taught in U.S. Pat. Nos. 4,255,211; and 4,332,974, said patents being incorporated herein by reference. In a three-color cell, the GaAs layer can be fabricated in a comparable procedure.

Preferably, the shorting junction layer and the top layer are fabricated from materials that can also contain gallium and arsenic so that a more uniform process can be effected with only the need to adjust the flow rate of the arsenic, the third element of the ternary compound, to create the larger bandgap top layer 18 and the shorting junction 16. With a GaAs shorting junction, the Ga source can be set at a constant flow rate and only the flow rates of the As and other V elements need be varied to grow the two-color cell. The three-color cell is fabricated by growing a middle homojunction layer of GaAs. Of course, the x and y values can be adjusted by adjusting the flow rates of the compounds containing the elements to obtain any desired bandgap energy of the layers between about 0.90 eV and 1.95 eV.

The invention will be more specifically described by referring to the following examples. However, it is understood that the invention is not intended to be limited in any way by the following specific example. Modifications which would be obvious to the ordinary skilled artisan, such as fabricating the solar cell with only PN regions for each layer or reversing the junctions to the NP configuration, and the like, are contemplated to be within the scope of the invention. The fabrication could also be accomplished with CVD or LPE, and the like.

EXAMPLES

EXAMPLE 1

A GaAs P-type wafer about 250 μm thick was used with a (100) orientation [2° off toward (110)]. The wafer was mounted on a molybdenum block with indium:zinc alloy solder. The wafer was then polished and lightly etched with a bromine-methanol solution, and loaded into the vacuum MO-CVD machine. The air was pumped out to form a vacuum of $2 \times 10^{-7}$ torr and resistive substrate heaters were turned on. When the substrate temperature reached 560° C. and the chamber pressure dropped below $5 \times 10^{-7}$ torr, the wafer was left for 10 minutes to desorb any oxide. Thereafter, a 50:50 $AsH_3:H_2$ gas mixture flow was turned on and set at 10 scc/min. Thereafter, the triethyl gallium (TEGa) and diethyl zinc (DEZn) flows were started simultaneously, thereby starting the growth of a P+ GaAs buffer layer about 1000 Å thick. This layer buried any remaining substrate surface contaminants. The TEGa flow was 1 scc/min. and the DEZn flow was 0.3 scc/min. During the growth of the GaAs layer, the substrate temperature was decreased to about 540° C. After 3 minutes, the trimethyl antimony (TMSb) flow was started. The flow rate was pre-set to 3 scc/min. The $AsH_3:H_2$ flow was cut back to 7 scc/min. and the P+ $GaAs_{0.88}Sb_{0.12}$ layer was grown in about 3 minutes.

Thereafter, the DEZn flow was stopped. The residual zinc in the system doped the growing layer P-type. The P region was grown in 90 minutes to a thickness of about 3 μm thick. Then the $H_2Se$ flow was started. The $H_2Se$ was purchased premixed with $H_2$ to 0.5% $H_2Se$ from Scientific Gas Products Company. The $H_2$ with 0.5% $H_2Se$ flow was set at 1% of the $AsH_3:H_2$ flow rate. The N+-type GaAsSb layer was grown in 10 minutes. Then the $AsH_3:H_2$ flow was increased to 10 scc/min. and the TMSb flow was stopped. The growing layer was N+-type GaAs. The substrate temperature was increased to about 560° C. After 1 minute, the TEGa flow was stopped. After 1 more minute, the $H_2Se$ flow was stopped. After 1 more minute delay, the TEGa and DEZn flows were started simultaneously at their previous flow rates. The growing layer was P+-type GaAs. After 3 minutes, the 50:50 $PH_3:H_2$ gas mixture flow was started, having been pre-set to 7 scc/min. The $AsH_3:H_2$ flow was cut back to 5 scc/min. The growing layer was P+-type $GaAs_{(0.82)}P_{(0.18)}$. After 3 minutes, the DEZn flow was stopped and a P-type layer was grown for 90 minutes.

To grow the N+-type $GaAs_{(0.82)}P_{(0.18)}$ layer, the $H_2:H_2Se$ flow was turned on at its prior setting. The N+-type layer was grown for 10 minutes. To end the semiconductor layer growths, the TEGa was turned off, followed by $PH_3$, $H_2Se$, $AsH_3$, and then finally the heaters were turned off. When the wafer had cooled down to room temperature, it was unloaded and grids and antireflection coatings were deposited. The voltages of the stacked layers were additive and the cell had a $V_{oc}$ of about 1.6 V at a $J_{sc}$ of about 5 milliamps. The voltage at 100 suns equivalent current was about 1.8 V. The uncalibrated spectral response for the cell showed two peaks at 1 μm and 0.77 μm. The peaks were attributable to GaAsSb and GaAsP layers, respectively.

EXAMPLE 2

A three-color solar cell was fabricated in accordance with the procedures outlined in Example 1; however, a middle bandgap GaAs layer, set off from the low and high bandgap layers by shorting junctions, was grown between the $GaAs_{1-y}Sb_y$ and $GaAs_{1-x}P_x$ layers. The TEGa flow rate was the same and the $AsH_3:H_2$ flow rate was increased to about 10 cc/min. for the growth of the GaAs layer. The doping was carried out as in Example 1. The voltages of the stacked layers were additive and the three-color cell had a $V_{oc}$ of about 2.8 V at a $J_{sc}$ of about 5 milliamps, ma. The uncalibrated spectral response for the cell showed three peaks at 0.96 μm, 0.86 μm, and 0.78 μm, which were attributable to GaAsSb, GaAs, and GaAsP layers, respectively.

What is claimed is:

1. A photovoltaic device comprising:
   a conductive substrate;
   a layer of GaAs$_{1-y}$Sb$_y$ having regions of differing conductivity forming a homojunction therein contacting said substrate and lattice matching the substrate to within about ±1%;
   a shorting junction layer contacting the surface of said GaAsSb layer opposite to the surface contacting said substrate;
   a layer of GaAs$_{1-x}$P$_x$ having a larger bandgap than said GaAsSb layer, said semiconductor layer contacting the surface of said shorting junction layer opposite to said surface contacting said GaAsSb layer; and
   means forming electrical contacts to said device to withdraw photogenerated current therefrom.

2. The solar cell according to claim 1 wherein y has the value of from about 0.1 to about 0.4 and x has the value of from about 0.1 to about 0.3.

3. The solar cell according to claim 2 wherein x and y are about 0.2.

4. The solar cell according to claim 1 wherein said shorting junction is an N$^+$-type germanium layer.

5. The solar cell according to claim 1 wherein said shorting junction is a P$^+$-type germanium layer.

6. The solar cell according to claim 2 wherein said shorting junction is a GaAs layer having a region of GaAs doped to N$^+$-type conductivity followed by a region of GaAs doped to P$^+$-type conductivity.

7. The solar cell according to claim 1, 3, 4, 5 or 6 wherein the GaAsSb layer has a bandgap of about 1.1 eV and the GaAsP layer has a bandgap of about 1.65 eV.

8. The solar cell according to claim 1, 2, 3, or 6 further comprising a GaAs homojunction layer between said GaAs$_{1-y}$Sb$_y$ and said GaAs$_{1-x}$P$_x$ layers, said GaAs layer having a bandgap greater than said GaAs$_{1-y}$Sb$_y$ layer but less than said GaAs$_{1-x}$P$_x$ layer and separated from said GaAs$_{1-x}$P$_x$ and GaAs$_{1-y}$Sb$_y$ layers by shorting junctions.

9. The solar cell according to claim 8 further comprising transition layers between said homojunction layers and said shorting junction layers.

10. A photovoltaic device comprising:
    a conductive substrate;
    a layer of GaAs$_{1-y}$Sb$_y$ having regions of different conductivity forming a homojunction therein and ohmically contacting said substrate and lattice matching said substrate to within about ±1%;
    a first shorting junction layer contacting the surface of said GaAsSb layer opposite to the side contacting said substrate;
    a layer of GaAs having a homojunction therein contacting said shorting junction layer on the surface opposite to the surface contacting said GaAsSb layer, said GaAs layer having a larger bandgap energy than said GaAs$_{1-y}$Sb$_y$ layer;
    a second shorting junction layer contacting said GaAs layer opposite to the surface contacting said first shorting junction layer;
    a layer of GaAs$_{1-x}$P$_x$ having a homojunction therein contacting the surface of said second shorting junction layer opposite to said surface contacting said GaAs layer, said GaAs$_{1-x}$P$_x$ layer having a larger bandgap energy than either said GaAsSb layer or said GaAs layer; and
    means forming electrical contacts to said device to withdraw photogenerated current and voltage therefrom.

11. The solar cell according to claim 10 further comprising transition layers between said homojunction layers and said shorting junction layers.

12. The solar cell according to claim 10 or 11 wherein said GaAsSb layer has a bandgap energy of about 1.1 eV, said GaAs layer has a bandgap energy of about 1.44 eV, and said GaAsP layer has a bandgap energy of about 1.85 eV.

13. A process of fabricating a multicolor solar cell comprising:
    mounting a conductive substrate in a chemical vapor deposition apparatus;
    evacuating said apparatus to a pressure of from about $1 \times 10^{-6}$ torr to about $1 \times 10^{-8}$ torr;
    heating said substrate to a temperature of from about 500° C. to about 650° C.;
    establishing a flow rate of an arsenic containing compound;
    establishing a flow rate of a gallium containing compound;
    adjusting the flow rates of said arsenic containing compound, an antimony containing compound and N-type and P-type dopants so as to grow a layer of GaAs$_{1-y}$Sb$_y$ on said substrate, said layer having a PN homojunction therein;
    terminating the flow of said antimony containing compound;
    adjusting the flow rate of said arsenic and N-type and P-type dopants so as to grow a first shorting junction on said GaAs$_{1-y}$Sb$_y$ layer;
    increasing the flow rate of said arsenic containing compound while varying the flow rates of said N-type and P-type dopants so as to grow a GaAs homojunction layer on said shorting junction layer;
    adjusting the flow rates of said N-type and P-type dopants so as to grow a second shorting junction on said GaAs layer;
    decreasing the flow of said arsenic containing compound and introducing a phosphorus containing compound while varying the flow rates of said N-type and P-type dopants so as to grow a GaAs$_{1-x}$P$_x$ homojunction layer on said second shorting junction layer;
    terminating the flows of said gallium containing compound, said arsenic containing compound, said phosphorus containing compound, and said N-type and P-type dopants; and
    removing said substrate from said apparatus and forming an electrical contact thereto.

14. The process according to claim 13 further comprising:
    adjusting the flow rate of the antimony containing compound so as to fabricate transition layers of GaAs$_{1-y}$Sb$_y$ between said substrate and said homojunction layer of GaAs$_{1-y}$Sb$_y$ and between said homojunction layer and said first shorting junction layer; and
    adjusting the flow rate of said phosphorus containing compound so as to grow a transition layer of GaAs$_{1-x}$P$_x$ between said second shorting junction and said GaAs$_{1-x}$P$_x$ layer.

15. The solar cell fabricated according to claim 13 or 14.

16. In a process of fabricating a multicolor solar cell having a plurality of homojunction III-V compound layers separated by shorting junction layers, the improvement which comprises:
    fabricating the semiconductor layers and shorting junction layers with a substantially constant flow rate of a III compound while varying the flow rates of the V compounds and N-type and P-type dopant sources.

* * * * *